United States Patent
Kim et al.

(10) Patent No.: US 10,629,836 B2
(45) Date of Patent: Apr. 21, 2020

(54) ORGANIC LIGHT EMITTING DIODE AND ORGANIC LIGHT EMITTING DIODE DISPLAY DEVICE INCLUDING THE SAME

(71) Applicant: LG DISPLAY CO., LTD., Seoul (KR)

(72) Inventors: Sung-Moo Kim, Paju-si (KR); Kyoung-Ji Bae, Uiwang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 247 days.

(21) Appl. No.: 15/633,140

(22) Filed: Jun. 26, 2017

(65) Prior Publication Data

US 2018/0138435 A1    May 17, 2018

(30) Foreign Application Priority Data

Nov. 11, 2016  (KR) .................. 10-2016-0150542

(51) Int. Cl.
  *H01L 51/50*    (2006.01)
  *H01L 27/32*    (2006.01)
  *H01L 51/00*    (2006.01)

(52) U.S. Cl.
  CPC ........ *H01L 51/508* (2013.01); *H01L 27/3213* (2013.01); *H01L 27/3246* (2013.01); *H01L 51/0004* (2013.01); *H01L 51/504* (2013.01); *H01L 51/5056* (2013.01); *H01L 51/5008* (2013.01); *H01L 51/5096* (2013.01); *H01L 2251/558* (2013.01)

(58) Field of Classification Search
  CPC ............... H01L 51/508; H01L 27/3213; H01L 27/3246
  See application file for complete search history.

(56) References Cited

U.S. PATENT DOCUMENTS

| | | | |
|---|---|---|---|
| 2006/0227079 A1* | 10/2006 | Kashiwabara | C09K 11/06 345/76 |
| 2014/0084256 A1 | 3/2014 | Kim et al. | |
| 2014/0131674 A1 | 5/2014 | Park et al. | |
| 2014/0183475 A1 | 7/2014 | Song et al. | |
| 2018/0182824 A1* | 6/2018 | Gu | H01L 27/3213 |

FOREIGN PATENT DOCUMENTS

| | | |
|---|---|---|
| CN | 101212025 A | 7/2008 |
| CN | 105390521 A | 3/2016 |
| KR | 10-2016-0055344 A | 5/2016 |

* cited by examiner

*Primary Examiner* — Errol V Fernandes
(74) *Attorney, Agent, or Firm* — Birch, Stewart, Kolasch & Birch, LLP

(57) ABSTRACT

An organic light emitting diode includes a first electrode; a hole auxiliary layer on the first electrode; a light emitting material layer on the hole auxiliary layer and emitting white light; an electron auxiliary layer on the light emitting material layer; and a second electrode on the electron auxiliary layer, wherein the light emitting material layer includes a first light emitting material layer, a second light emitting material layer and a third light emitting material layer sequentially layered, and wherein the first light emitting material layer includes an electron blocking material.

16 Claims, 7 Drawing Sheets though the electron injecting layer 6 and the electron transporting layer 5 from the cathode 7, whereby an exciton 8 is generated and light is emitted from the exciton 8. Here, the light has a color corresponding to a band gap of the light emitting material layer 4.

ORGANIC LIGHT EMITTING DIODE AND ORGANIC LIGHT EMITTING DIODE DISPLAY DEVICE INCLUDING THE SAME

CROSS-REFERENCE TO RELATED APPLICATION

The present application claims priority from and the benefit under 35 U.S.C. § 119(a) of Korean Patent Application No. 10-2016-0150542 filed on Nov. 11, 2016, which is hereby incorporated by reference in its entirety.

BACKGROUND OF THE INVENTION

Field of the Disclosure

The present disclosure relates to an organic light emitting diode display device, and more particularly, to an organic light emitting diode and an organic light emitting diode display device including the same, which is capable of lowering power consumption.

Discussion of the Related Art

Recently, flat panel displays have been widely developed and applied to various fields because of their thin profile, light weight, and low power consumption.

Among the flat panel displays, organic light emitting diode (OLED) display devices, which may be referred to as organic electroluminescent display devices, emit light due to the radiative recombination of an exciton after forming the exciton from an electron and a hole by injecting charges into a light emitting layer between a cathode for injecting electrons and an anode for injecting holes.

The OLED display devices include a flexible substrate such as plastic; because they are self-luminous, the OLED display devices have excellent contrast ratios; the OLED display devices have a response time of several micro seconds, and there are advantages in displaying moving images; the OLED display devices have wide viewing angles and are stable under low temperatures; since the OLED display devices are driven by a low voltage of direct current (DC) 5V to 15V, it is easy to design and manufacture driving circuits; and the manufacturing processes of the OLED display device are simple since only deposition and encapsulation steps are required.

FIG. 1 is a view of illustrating a band diagram of a related art OLED display device.

In FIG. 1, the OLED display device includes an anode 1, a cathode 7 and a light emitting material layer 4 between the anode 1 and the cathode 7. A hole transporting layer (HTL) 3 is disposed between the anode 1 and the light emitting material layer 4 for injecting holes into the light emitting material layer 4, and an electron transporting layer (ETL) 5 is disposed between the cathode 7 and the light emitting material layer 4 for injecting electrodes into the light emitting material layer 4. At this time, to further efficiently inject the holes and the electrons, a hole injecting layer (HIL) 2 may be disposed between the anode 1 and the hole transporting layer 3, and an electron injecting layer (EIL) 6 may be disposed between the cathode 7 and the electron transporting layer 5.

In the OLED display device having the above-mentioned structure, a hole (+) injected into the light emitting material layer 4 through the hole injecting layer 2 and the hole transporting layer 3 from the anode 1 is combined with an electron (−) injected into the light emitting material layer 4 through the electron injecting layer 6 and the electron transporting layer 5 from the cathode 7, whereby an exciton 8 is generated and light is emitted from the exciton 8. Here, the light has a color corresponding to a band gap of the light emitting material layer 4.

The light emitting material layer 4, the hole injecting layer 2, the hole transporting layer 3, the electron transporting layer 5 and the electron injecting layer 6 are formed by a vacuum thermal evaporation method, in which an organic material is selectively deposited using a fine metal mask.

By the way, the evaporation method increases manufacturing costs due to preparation of the mask, and it is difficult to apply the evaporation method to a display device with a large size and high resolution because of production deviation, sagging and a shadow effect of the mask.

Meanwhile, the OLED display device is applied to various products such as flexible displays and transparent displays as well as mobile devices and televisions. To use the products for a long time, it is needed to decrease power consumption.

SUMMARY OF THE INVENTION

Accordingly, the present disclosure is directed to an organic light emitting diode and an organic light emitting diode display device including the same that substantially obviate one or more of the problems due to limitations and disadvantages of the related art.

An object of the present disclosure is to provide an organic light emitting diode and an organic light emitting diode display device including the same having a large size and a high definition.

Another object of the present disclosure is to decrease manufacturing costs of an organic light emitting diode and an organic light emitting diode display device including the same.

Another object of the present disclosure is to lower power consumption of an organic light emitting diode and an organic light emitting diode display device including the same.

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided a organic light emitting diode including a first electrode; a hole auxiliary layer on the first electrode; a light emitting material layer on the hole auxiliary layer and emitting white light; an electron auxiliary layer on the light emitting material layer; and a second electrode on the electron auxiliary layer, wherein the light emitting material layer includes a first light emitting material layer, a second light emitting material layer and a third light emitting material layer sequentially layered, and wherein the first light emitting material layer includes an electron blocking material.

In another aspect, an organic light emitting diode display device includes a substrate on which red, green, blue and white pixel regions are defined; a first electrode in each pixel region on the substrate; a light emitting layer on the first electrode and including red, green, blue and white light emitting material layers disposed in the red, green, blue and white pixel regions, respectively; and a second electrode on the light emitting layer, wherein the white light emitting material layer includes a first light emitting material layer, a second light emitting material layer and a third light emitting material layer sequentially layered, and wherein the first light emitting material layer includes an electron blocking material.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION OF THE EMBODIMENTS

Reference will now be made in detail to embodiments of the disclosure, examples of which are illustrated in the accompanying drawings.

Figure 1:
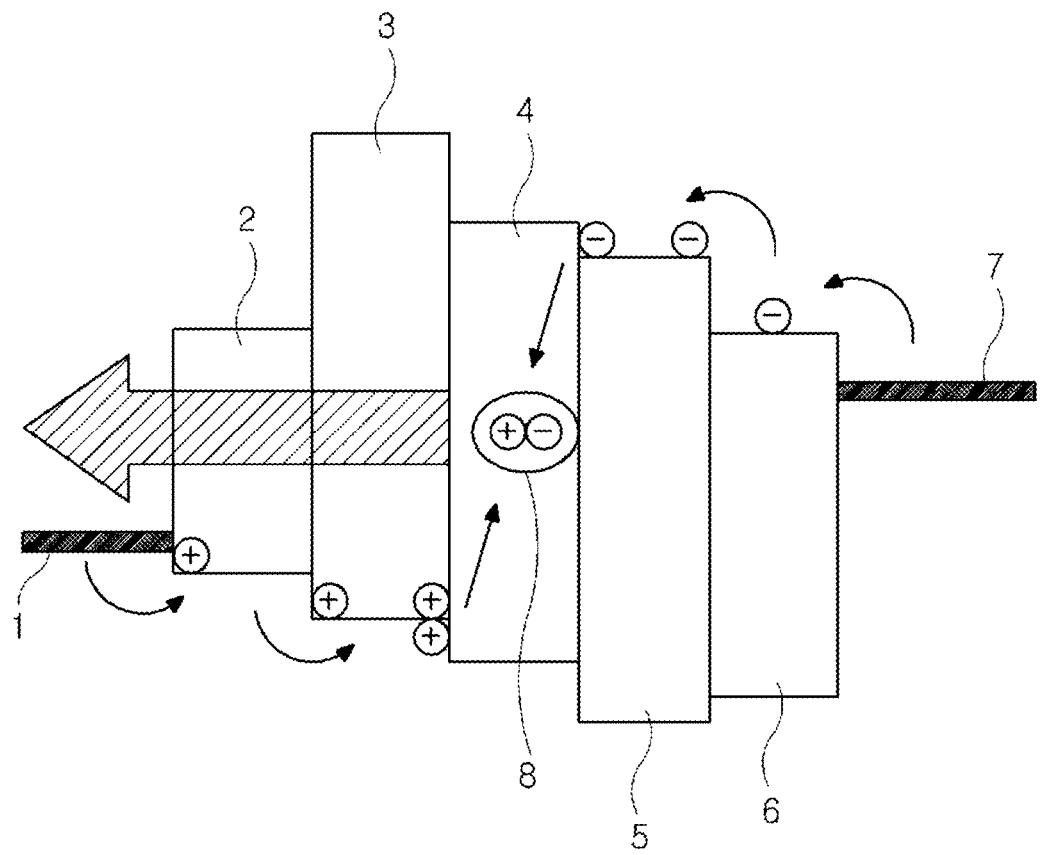
FIG. 1 is a view of illustrating a band diagram of a related art OLED display device.
Figure 2:
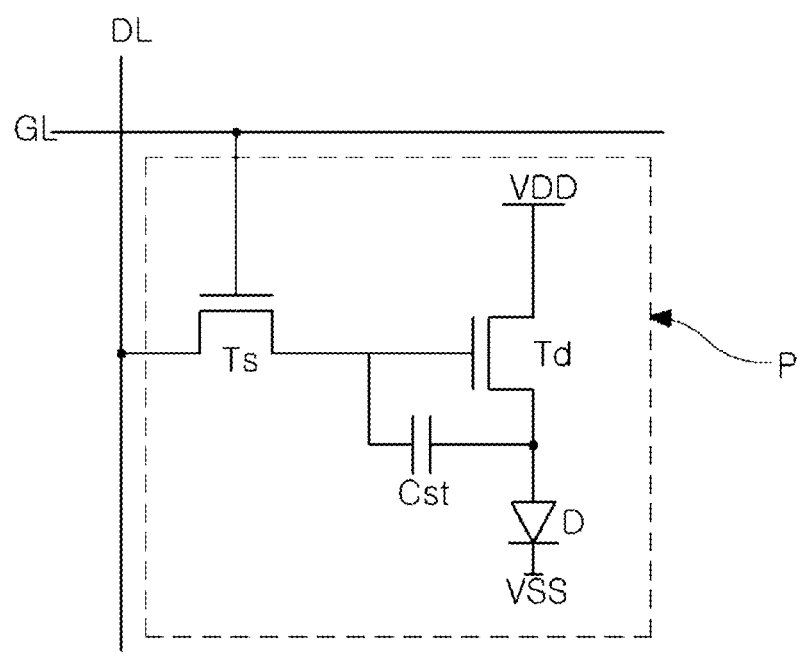
FIG. 2 is a circuit diagram of one pixel region of an OLED display device according to an embodiment of the present disclosure.

FIG. 2 is a circuit diagram of one pixel region of an OLED display device according to an embodiment of the present disclosure.

In FIG. 2, the OLED display device according to the embodiment of the present disclosure includes a gate line GL, a data line DL, a switching thin film transistor Ts, a driving thin film transistor Td, a storage capacitor Cst and a light emitting diode D. The gate line GL and the data line DL cross each other to define a pixel region P. The switching thin film transistor Ts, the driving thin film transistor Td, the storage capacitor Cst and the light emitting diode D are formed in the pixel region P.

More particularly, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts, and a source electrode of the driving thin film transistor Td is connected to a high voltage supply VDD. An anode of the light emitting diode D is connected to a drain electrode of the driving thin film transistor Td, and a cathode of the light emitting diode D is connected to a low voltage supply VSS. The storage capacitor Cst is connected to the gate electrode and the drain electrode of the driving thin film transistor Td.

The OLED display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts. When the driving thin film transistor Td is turned on by the data signal, an electric current flowing through the light emitting diode D is controlled, thereby displaying an image. The light emitting diode D emits light due to the current supplied through the driving thin film transistor Td from the high voltage supply VDD.

Namely, the amount of the current flowing through the light emitting diode D is proportional to the magnitude of the data signal, and the intensity of light emitted by the light emitting diode D is proportional to the amount of the current flowing through the light emitting diode D. Thus, the pixel regions P show different gray levels depending on the magnitude of the data signal, and as a result, the OLED display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light emitting diode D to be constant and the gray level shown by the light emitting diode D to be maintained until a next frame.

Figure 3:
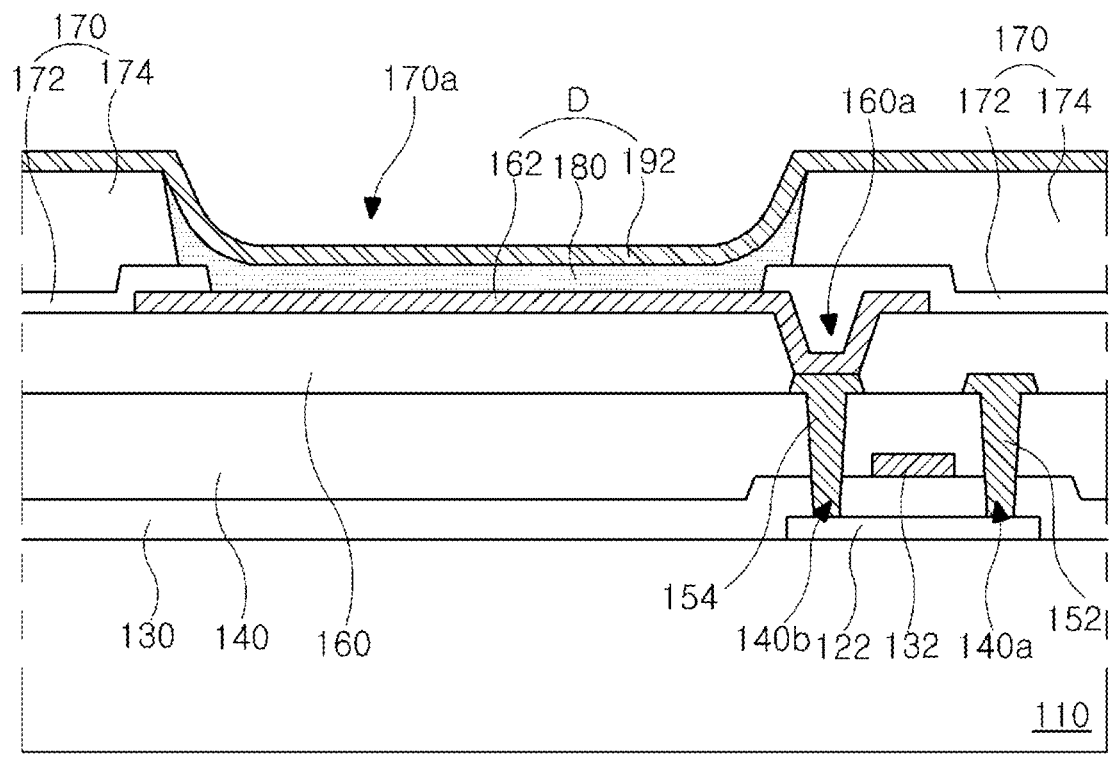
FIG. 3 is a cross-sectional view of an OLED display device according to the embodiment of the present disclosure.

FIG. 3 is a cross-sectional view of an OLED display device according to the embodiment of the present disclosure and shows one pixel region.

As shown in FIG. 3, in one pixel region of the OLED display device according to the embodiment, a semiconductor layer 122 is formed on an insulating substrate 110. The substrate 110 can be a glass substrate or a plastic substrate.

The semiconductor layer 122 can be formed of an oxide semiconductor material. In addition, the OLED display device including the semiconductor layer 122 formed of an oxide semiconductor material can include a light-blocking pattern and a buffer layer formed under the semiconductor layer 122. The light-blocking pattern blocks light from the outside or light emitted from a light emitting diode to prevent the semiconductor layer 122 from being degraded by the light. Alternatively, the semiconductor layer 122 can be formed of polycrystalline silicon, and in this instance, a buffer layer can be formed between the substrate 110 and the semiconductor layer 122. Additionally, impurities can be doped in both ends of the semiconductor layer 122.

A gate insulating layer 130 of an insulating material is formed on the semiconductor layer 122 over substantially all of the substrate 110. The gate insulating layer 130 can be formed of an inorganic insulating material such as silicon oxide ($SiO_2$). When the semiconductor layer 122 is formed of polycrystalline silicon, the gate insulating layer 130 can be formed of at least one of silicon oxide ($SiO_2$) and silicon nitride ($SiN_x$).

A gate electrode 132 of a conductive material such as metal can be formed on the gate insulating layer 130 to correspond to the semiconductor layer 122. In addition, a gate line and a first capacitor electrode can be formed on the gate insulating layer 130. The gate line extends in a first direction, and the first capacitor electrode can be connected to the gate electrode 132.

Here, the OLED display device according to the embodiment of the present disclosure includes the gate insulating layer 130 formed over substantially all of the substrate 110. Alternatively, the gate insulating layer 130 can be patterned to have the same shape as the gate electrode 132.

An inter insulating layer 140 of an insulating material is formed on the gate electrode 132 over substantially all of the substrate 110. The inter insulating layer 140 can be formed of an inorganic insulating material such as silicon oxide ($SiO_2$) and silicon nitride (SiNx) or an organic insulating material such as benzocyclobutene and photo acryl.

The inter insulating layer 140 includes first and second contact holes 140a and 140b exposing top surfaces of both sides of the semiconductor layer 122. The first and second contact holes 140a and 140b are spaced apart from the gate electrode 132, and the gate electrode 132 is disposed between the first and second contact holes 140a and 140b. The first and second contact holes 140a and 140b are also formed in the gate insulating layer 130. Alternatively, when the gate insulating layer 130 is patterned to have the same shape as the gate electrode 132, the first and second contact holes 140a and 140b are formed only in the inter insulating layer 140.

A source electrode 152 and a drain electrode 154 of a conductive material such as metal are formed on the inter insulating layer 140. In addition, a data line, a power supply line and a second capacitor electrode can be formed on the inter insulating layer 140. The data line and the power supply line extend in a second direction.

The source and drain electrodes 152 and 154 are spaced apart from each other with respect to the gate electrode 132. The source and drain electrodes 152 and 154 contact both sides of the semiconductor layer 122 through the first and second contact holes 140a and 140b, respectively. The data line can cross the gate line to define a pixel region. In addition, the power supply line can be spaced apart from the data line. The second capacitor electrode can be connected to the drain electrode 154 and can overlap the first capacitor electrode to form a storage capacitor with the inter insulating layer 140 therebetween as a dielectric substance.

In the OLED display device, a thin film transistor includes the semiconductor layer 122, the gate electrode 132, the source electrode 152 and the drain electrode 154. The thin film transistor can have a coplanar structure where the gate electrode 132 and the source and drain electrodes 152 and 154 are disposed at sides of the semiconductor layer 122, over the semiconductor layer 122.

Alternatively, the thin film transistor can have an inverted staggered structure where the gate electrode is disposed under the semiconductor layer and the source and drain electrodes are disposed over the semiconductor layer. In this instance, the semiconductor layer can be formed of amorphous silicon.

In addition, the thin film transistor can be a driving thin film transistor of the OLED display device. A switching thin film transistor can have the same structure as the driving thin film transistor formed over the substrate 110. At this time, the gate electrode 132 of the driving thin film transistor is connected to a drain electrode of the switching thin film transistor, and the source electrode 152 of the driving thin film transistor is connected to the power supply line. Also, the gate electrode and the source electrode of the switching thin film transistor are connected to the gate line and the data line, respectively.

A passivation layer 160 of an insulating material is formed on the source and drain electrodes 152 and 154 over substantially all of the substrate 110. The passivation layer 150 can be formed of an inorganic insulating material such as silicon oxide ($SiO_2$) and silicon nitride (SiNx) or an organic insulating material such as benzocyclobutene and photo acryl. The passivation layer 160 can have a flat top surface.

The passivation layer 160 has a contact hole 160a exposing the drain electrode 154. In FIG. 3, although the drain contact hole 160a is formed directly over the second contact hole 140b, the drain contact hole 160a can be spaced apart from the second contact hole 140b.

A first electrode 162 of a conductive material having a relatively high work function is formed on the passivation layer 160. The first electrode 162 is disposed in each pixel region and contacts the drain electrode 154 through the drain contact hole 160a. For example, the first electrode 162 can be formed of a transparent conductive material such as indium tin oxide (ITO) and indium zinc oxide (IZO).

A bank 170 of an insulating material is formed on the first electrode 162. The bank 170 is disposed between adjacent pixel regions and has a transmissive hole 170a exposing the first electrode 162. The bank layer 170 covers edges of the first electrode 162.

The bank 170 includes a first bank 172 and a second bank 174 on the first bank 172, and the first bank 172 has a wide width than the second bank 174. The first bank 172 can be formed of a material having relatively high surface energy to decrease a contact angle with a material of a light emitting layer formed later. The second bank 174 can be formed of a material having relatively low surface energy to increase a contact angle with the material of the light emitting layer formed later such that the material of the light emitting layer is prevented from overflowing into a next pixel region. For example, the first bank 172 can be formed of an inorganic insulating material or an organic insulating material having a hydrophilic property, and the second bank 174 can be formed of an organic insulating material having a hydrophobic property.

Alternatively, the first bank 172 and the second bank 174 can be formed of the same material and form one body. In this instance, the first bank 174 and the second bank 174 can be formed of an organic insulating material having a hydrophobic property.

On the other hand, the bank can have a single-layered structure of an organic insulating material having a hydrophobic property.

A light emitting layer 180 is formed on the first electrode 162 exposed by the transmissive hole 170a of the bank 170. The light emitting layer 180 can be formed through a solution process. A printing method or a coating method using an injection apparatus including a plurality of nozzles, not limited to this, can be used as the solution process. For example, an inkjet printing method can be used as the solution process.

The light emitting layer 180 can include a hole auxiliary layer, a light-emitting material layer and an electron auxiliary layer sequentially layered on the first electrode 162. The hole auxiliary layer can include at least one of a hole injecting layer and a hole transporting layer, and the electron auxiliary layer can include at least one of an electron transport layer and an electron injecting layer.

Here, the hole auxiliary layer and the light-emitting material layer can be formed only in the transmissive hole 170a, and the electron auxiliary layer can be formed over substantially all of the substrate 110. In this instance, the hole auxiliary layer and the light-emitting material layer can be formed through the solution process, and the electron auxiliary layer can be formed through a vacuum thermal evaporation process.

A second electrode 192 of a conductive material having relatively low work function is formed on the light emitting layer 180 over substantially all of the substrate 110. Here, the second electrode 192 can be formed of aluminum (Al), magnesium (Mg), silver (Ag) or their alloy.

The first electrode 162, the light emitting layer 180 and the second electrode 192 constitute a light emitting diode D. The first electrode 162 functions as an anode, and the second electrode 192 serves as a cathode.

An encapsulation film can be formed on the second electrode 192 to prevent moisture from the outside from permeating into the light emitting diode D. For example, the encapsulation film can have a structure of a first inorganic insulating layer, an organic insulating layer and a second inorganic insulating layer sequentially layered and is not limited to this.

Here, the OLED display device according to the embodiment can be a bottom emission type where light emitted from the light emitting layer 180 is outputted to the outside through the first electrode 162.

Alternatively, the OLED display device according to the embodiment can be a top emission type where light emitted from the light emitting layer 180 is outputted to the outside through the second electrode 192. At this time, the first electrode 162 further includes a reflective layer of an opaque conductive material. For example, the reflective layer can be formed of aluminum-palladium-copper (APC) alloy, and the first electrode 162 can have a triple-layered structure of ITO/APC/ITO. In addition, the second electrode 192 can have a relatively thin thickness such that light is transmitted therethrough. At this time, the transmittance of the second electrode 192 can be about 45 to 50%.

First Embodiment

Figure 4:
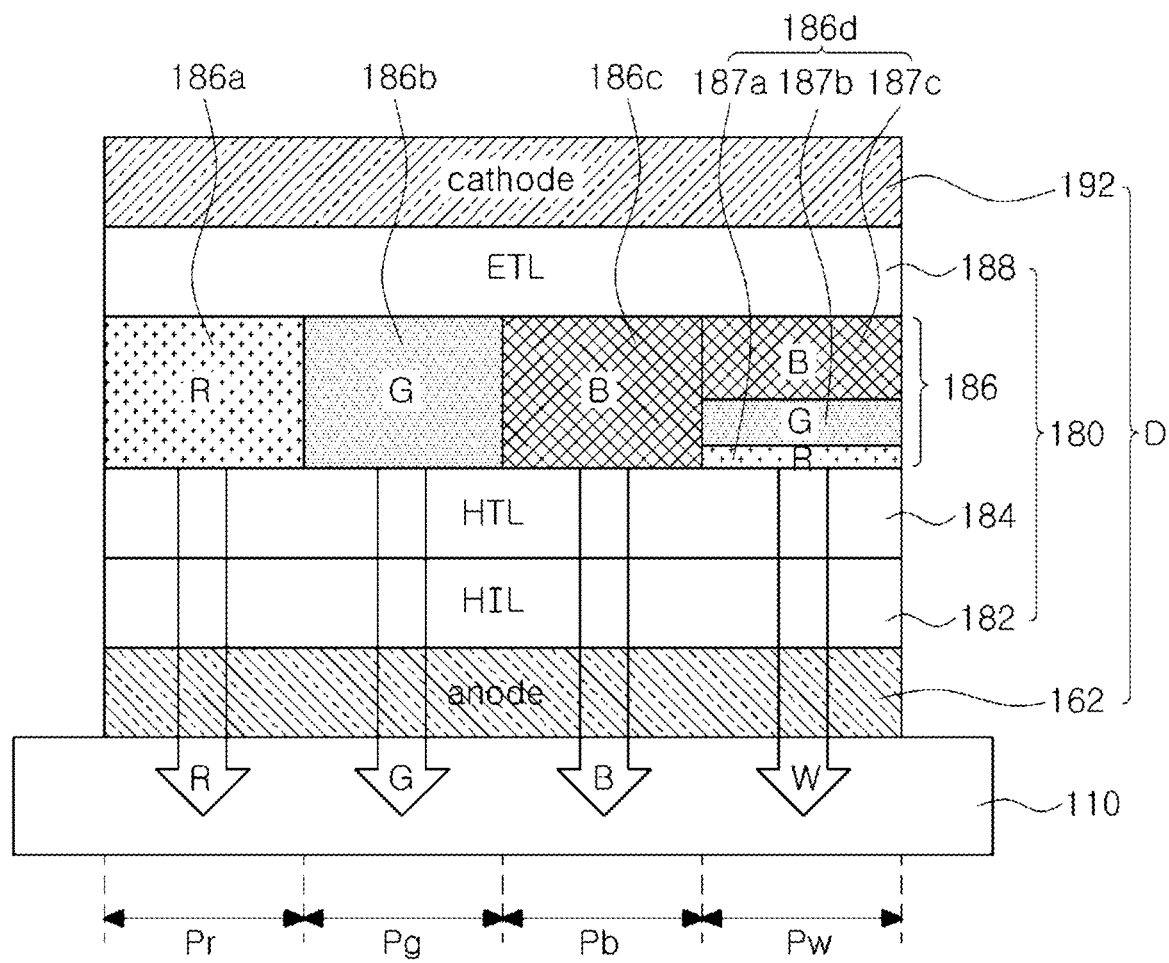
FIG. 4 is a cross-sectional view of an OLED display device according to a first embodiment of the present disclosure.

FIG. 4 is a cross-sectional view of an OLED display device according to a first embodiment of the present disclosure and shows one pixel region.

In FIG. 4, red, green, blue and white pixel regions Pr, Pg, Pb and Pw are defined on a substrate 110. The red, green, blue and white pixel regions Pr, Pg, Pb and Pw correspond to red, green, blue and white sub pixels, respectively, and the red, green, blue and white sub pixels constitute a pixel. A light emitting diode D is disposed in each pixel region Pr, Pg, Pb and Pw. The light emitting diode D includes a first electrode 162, a light emitting layer 180 and a second electrode 192. The light emitting layer 180 includes a hole injecting layer (HIL) 182, a hole transporting layer (HTL) 184, a light emitting material layer 186, and an electron transporting layer (ETL) 188.

More particularly, the first electrode 162 is formed in each of the red, green, blue and white pixel regions Pr, Pg, Pb and Pw as an anode. In the figure, although the first electrodes 162 in the red, green, blue and white pixel regions Pr, Pg, Pb and Pw are connected to each other, the first electrodes 162 in the red, green, blue and white pixel regions Pr, Pg, Pb and Pw are separated from each other.

The first electrode 162 can be formed of a transparent conductive material such as indium tin oxide (ITO) and indium zinc oxide (IZO).

The hole injecting layer 182 is formed on the first electrode 162. The hole injecting layer 182 can be formed through a solution process. The hole injecting layer 182 can be separated by the red, green, blue and white pixel regions Pr, Pg, Pb and Pw. Alternatively, the hole injecting layer 182 in one pixel region Pr, Pg, Pb and Pw can be connected to another hole injecting layer 182 in a next pixel region Pr, Pg, Pb and Pw to form one body.

For example, the hole injecting layer 182 can be formed of at least one selected from, but is not limited to, a material group including arylamine based materials such as NATA (4,4',4''-Tris(N,N-diphenyl-amino)triphenylamine), 2T-NATA (4,4',4''-tris (N-(2-naphthyl)-N-phenylamino)triphenylamine) and NPNPB (N,N'-diphenyl-N,N'-di-[4-(N,N-diphenyl-amino)phenyl]benzidine); and p-doped materials such as F4-TCNQ (2,3,5,6-Tetrafluoro-7,7,8,8-tetracyanoquinodimethane) and PPDN (pyrazino(2,3-f)[1,10]phenanthroline-2,3-dicarbonitrile).

The hole transporting layer 184 is formed on the hole injecting layer 182. The hole transporting layer 184 can be formed through a solution process. The hole transporting layer 184 can be separated by the red, green, blue and white pixel regions Pr, Pg, Pb and Pw. Alternatively, the hole transporting layer 184 in one pixel region Pr, Pg, Pb and Pw can be connected to another hole transporting layer 184 in a next pixel region Pr, Pg, Pb and Pw to form one body.

For instance, the hole transporting layer 184 can be formed of one selected from, but is not limited to, a material group including arylamine based materials, starbust aromatic amine based materials, spiro-ladder type materials, NPD (N,N-dinaphthyl-N,N'-diphenyl benzidine), s-TAD (2,2',7,7'-tetrakis-(N,N-diphenylamino)-9,9-spirobifluoren), and MTDATA (4,4',4''-tris (N-3-methylphenyl-N-phenyl-amino)-triphenylamine).

The arylamine based materials can include TPD (N,N'-bis-(3-methylphenyl)-N,N'-bis-(phenyl)-benzidine), PPD, TTBND, FFD, p-dmDPS and TAPC. The starburst aromatic amine based materials can include TCTA, PTDATA, TDAPB, TDBA, 4-a and TCTA. The spiro-ladder type materials can include spiro-TPD (N,N'-Bis(3-methylphenyl)-N,N'-bis(phenyl)-2,7-diamino-9,9-spirobifluorene), spiro-mTTB (2,2',7,7'-Octa(m-tolylamine)-9,9-spirobifluorene) and spiro-2.

The hole injecting layer 182 and the hole transporting layer 184 constitute a hole auxiliary layer.

The light emitting material layer 186 is formed on the hole transporting layer 184. The light emitting material layer 186 can be formed through a solution process. The light emitting material layer 186 includes a red light emitting material layer 186a, a green light emitting material layer 186b, a blue light emitting material layer 186c and a white light emitting material layer 186d corresponding to the red, green, blue and white pixel regions Pr, Pg, Pb and Pw, respectively. The red, green and blue light emitting material layers 186a, 186b and 186c include red, green and blue light emitting materials R, G and B emitting red, green and blue, respectively.

The white light emitting material layer 186d includes first, second and third light emitting material layers 187a, 187b and 187c sequentially layered on the hole transporting layer 184. Each of the first, second and third light emitting material layers 187a, 187b and 187c can include one of red, green and blue light emitting materials. The materials of the first, second and third light emitting material layers 187a, 187b and 187c can be different from each other. For example, as shown in FIG. 4, the first, second and third light emitting material layers 187a, 187b and 187c of the white light emitting material layer 186d can include red, green and blue light emitting materials R, G and B, respectively. Here, to implement white light having a predetermined color temperature, it is beneficial that a thickness of the second light emitting material layer 187b is larger than a thickness of the first light emitting material layer 187a and is smaller than a thickness of the third light emitting material layer 187c.

For instance, in the white pixel region Pw, the first light emitting material layer 187a is formed by dropping one drop of a first solution including a red light emitting material and drying the first solution, the second light emitting material layer 187b thicker than the first light emitting material layer 187a is formed on the first light emitting material layer 187a by dropping seven drops of a second solution including a green light emitting material and drying the second solution, and the third light emitting material layer 187c thicker than the second light emitting material layer 187b is formed on the second light emitting material layer 187b by dropping twenty drops of a third solution including a blue light emitting material and drying the third solution. Accordingly, the first light emitting material layer 187a can have the thickness of about 3 nm, the second light emitting material layer 187b can have the thickness of about 20 nm, and the third light emitting material layer 187c can have the thickness of about 50 nm. However, the number of dropping a solution and the thickness of a light emitting material layer are not limited to these and can be changed according to a concentration of the solution.

The first, second and third light emitting material layers 187a, 187b and 187c can be formed together in steps of forming the red, green and blue light emitting material layers 186a, 186b and 186c, respectively.

Here, the red light emitting material can be formed of a host material, which includes at least one of a carbazole material such as CBP (carbazole biphenyl) and mCP (1,3-bis(carbazol-9-yl)); fluorene; and acridine containing an alkyl group, and a dopant material, which contains at least one selected from a phosphorescent material group including PIQIr(acac)(bis(1-phenylisoquinoline)acetylacetonate iridium), PQIr(acac)(bis (1-phenylquinoline)acetylacetonate iridium), PQIr(tris(1-phenylquinoline)iridium), and PtOEP (octaethylporphyrin platinum). Alternatively, the red light emitting material can be formed of a fluorescent material including PBD:Eu(DBM)3(Phen), Perylene, and so on, as the dopant material. However, the red light emitting material is not limited to these. The host and the dopant of the red light emitting material can be connected to each other, thereby forming one type of a monomer, an oligomer and a polymer.

In addition, the green light emitting material can be formed of a host material, which includes at least one of a carbazole material such as CBP (carbazole biphenyl) and mCP (1,3-bis(carbazol-9-yl)); fluorene; and acridine containing an alkyl group, and a dopant material, which contains a phosphorescent material including Ir(ppy)3(fac tris (2-phenylpyridine)iridium), and so on. Alternatively, the green light emitting material can be formed of a fluorescent material including Alq3(tris(8-hydroxyquinolino)aluminum), and so on, as the dopant material. However, the green light emitting material is not limited to these. The host and the dopant of the green light emitting material can be connected to each other, thereby forming one type of a monomer, an oligomer and a polymer.

Meanwhile, the blue light emitting material can be formed of a host material, which includes at least one of a carbazole material such as CBP (carbazole biphenyl) and mCP (1,3-bis(carbazol-9-yl)); fluorene; and acridine containing an alkyl group, and a dopant material, which contains a phosphorescent material including (4,6-F2ppy)2Irpic, and so on. Alternatively, the blue light emitting material can be formed of a fluorescent material, which contains at least one selected from a material group including anthracene, spiro-DPVBi, spiro-6P, distyryl benzene (DSB), distyryl arylene (DSA), PFO-based polymer and PPV-based polymer, as the dopant material. However, the blue light emitting material is not limited to these. The host and the dopant of the blue light emitting material can be connected to each other, thereby forming one type of a monomer, an oligomer and a polymer.

Next, the electron transporting layer 188 is formed on the light emitting material layer 186. The electron transporting layer 188 can be formed through a solution process. The electron transporting layer 188 can be separated by the red, green, blue and white pixel regions Pr, Pg, Pb and Pw. Alternatively, the electron transporting layer 188 in one pixel region Pr, Pg, Pb and Pw can be connected to another electron transporting layer 188 in a next pixel region Pr, Pg, Pb and Pw to form one body.

For example, the electron transporting layer 188 can be formed of at least one selected from a material group including Alq3 (tris(8-hydroxyquinolino)aluminum), PBD, TAZ, spiro-PBD, BAlq, and SAlq, but is not limited to these.

The second electrode 192 is formed on the electron transporting layer 188 as a cathode. The second electrode 192 can be formed through a deposition process. The second electrode 192 in one pixel region Pr, Pg, Pb and Pw can be connected to another second electrode 192 in a next pixel region Pr, Pg, Pb and Pw to form one body.

For instance, the second electrode 192 can be formed of, but is not limited to, one of aluminum (Al), magnesium (Mg) and alloy of aluminum and magnesium (AlMg).

In the meantime, to inject electrons well, an electron injecting layer can be formed between the electron transporting layer 188 and the second electrode 192. The electron transporting layer 188 and the electron injecting layer can constitute an electron auxiliary layer.

Like this, in the OLED display device according to the first embodiment, since the light emitting material layer 186 can be formed through the solution process, which is applicable to a relatively small area, the manufacturing costs can be reduced due to a decrease in the number of the evaporation processes, and an OLED display device having a large size and high definition can be produced.

Moreover, because one pixel further includes the white sub pixel emitting the white light in addition to the red, green and blue sub pixels, the power consumption can be lowered.

By the way, in the OLED display device according to the first embodiment, when the thickness of the first light emitting material layer 187a in the white pixel region Pw is too thin, an emission problem can be caused.

Figure 5A:
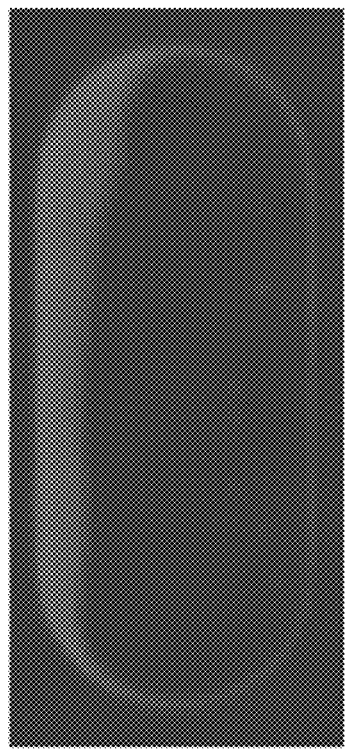
FIGS. 5A and 5B are pictures showing the light emitting material layer and an emission image in the white pixel region of the OLED display device according to the first embodiment of the present disclosure.
Figure 5B:
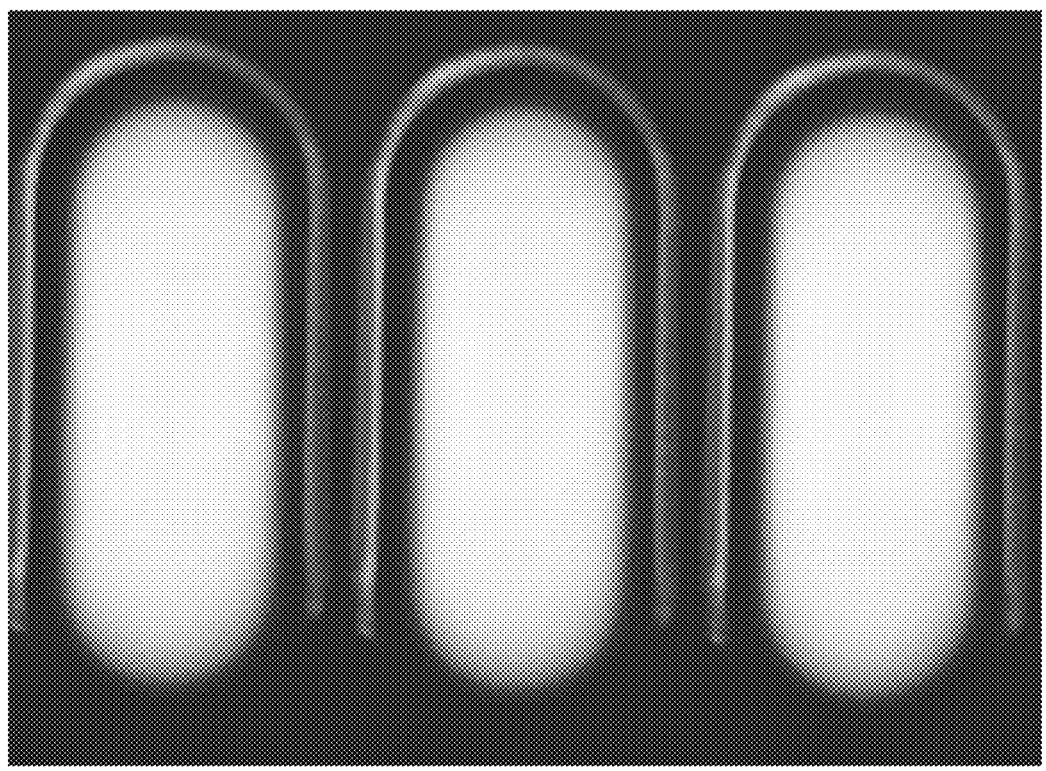

FIGS. 5A and 5B are pictures showing the light emitting material layer and an emission image in the white pixel region of the OLED display device according to the first embodiment of the present disclosure.

As shown in FIG. 5A, in the OLED display device according to the first embodiment, when the thickness of the first light emitting material layer 187a in the white pixel region Pw is too thin, a drop amount of a solution necessary for the first light emitting material layer 187a is very small, and thus the dropped solution cannot be uniformly spread in the white pixel region Pw.

Accordingly, the first light emitting material layer 187a is not uniformly formed in the white pixel region Pw, and as shown in FIG. 5B, the emission image is not uniform in the white pixel region Pw.

Second Embodiment

In a second embodiment of the present disclosure, a first light emitting material layer is formed in a white pixel region, and thus performance of a device can be improved.

Figure 6:
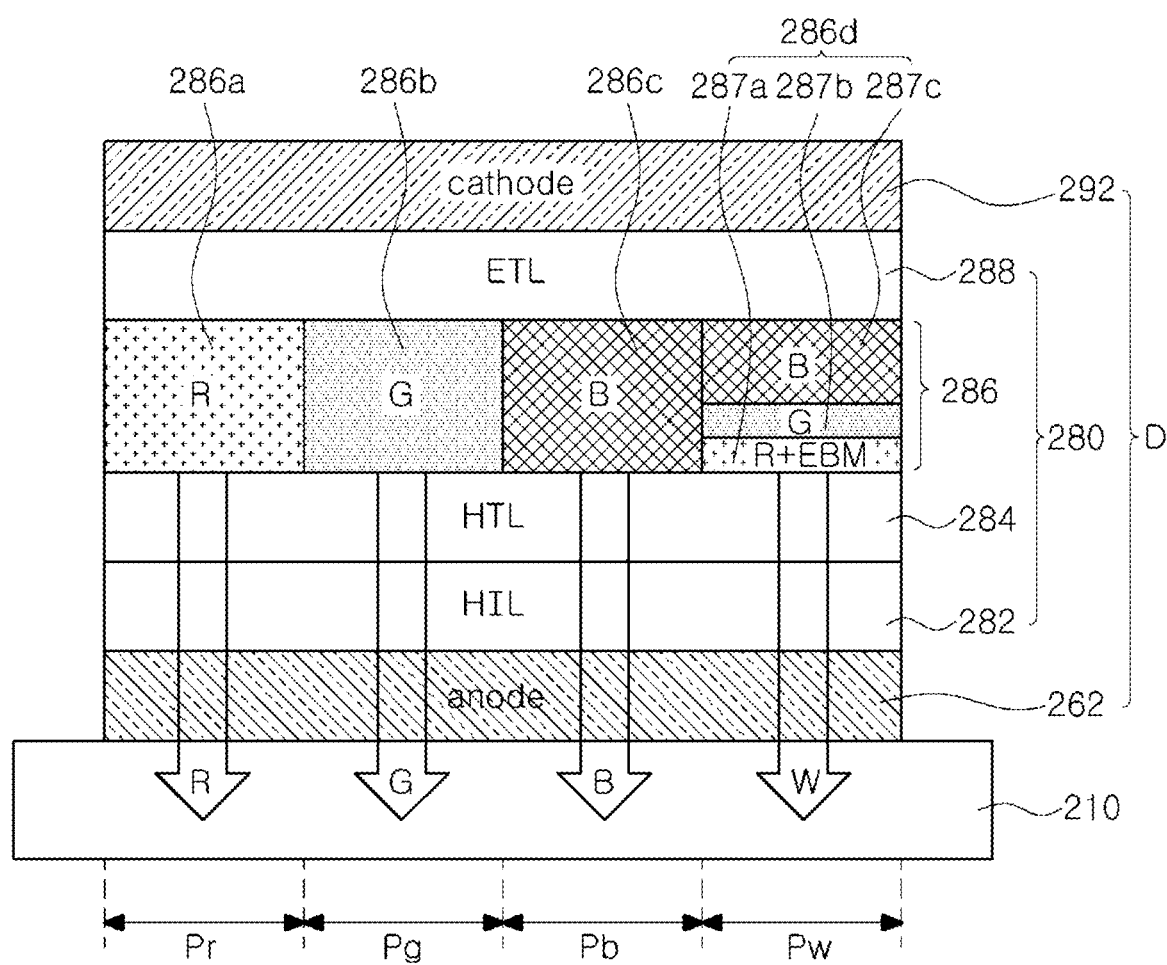
FIG. 6 is a cross-sectional view of an OLED display device according to a second embodiment of the present disclosure.

FIG. 6 is a cross-sectional view of an OLED display device according to a second embodiment of the present disclosure and shows one pixel region.

In FIG. 6, red, green, blue and white pixel regions Pr, Pg, Pb and Pw are defined on a substrate 210. The red, green, blue and white pixel regions Pr, Pg, Pb and Pw correspond to red, green, blue and white sub pixels, respectively, and the red, green, blue and white sub pixels constitute a pixel. A light emitting diode D is disposed in each pixel region Pr, Pg, Pb and Pw. The light emitting diode D includes a first electrode 262, a light emitting layer 280 and a second electrode 292. The light emitting layer 280 includes a hole injecting layer (HIL) 282, a hole transporting layer (HTL) 284, a light emitting material layer 286, and an electron transporting layer (ETL) 288.

More particularly, the first electrode 262 is formed in each of the red, green, blue and white pixel regions Pr, Pg, Pb and Pw as an anode. In the figure, although the first electrodes 262 in the red, green, blue and white pixel regions Pr, Pg, Pb and Pw are connected to each other, the first electrodes 262 in the red, green, blue and white pixel regions Pr, Pg, Pb and Pw are separated from each other.

The first electrode 262 can be formed of a transparent conductive material such as indium tin oxide (ITO) and indium zinc oxide (IZO).

The hole injecting layer 282 is formed on the first electrode 262. The hole injecting layer 282 can be formed through a solution process. The hole injecting layer 282 can be separated by the red, green, blue and white pixel regions Pr, Pg, Pb and Pw. Alternatively, the hole injecting layer 282 in one pixel region Pr, Pg, Pb and Pw can be connected to another hole injecting layer 282 in a next pixel region Pr, Pg, Pb and Pw to form one body.

For example, the hole injecting layer 282 can be formed of at least one selected from, but is not limited to, a material group including arylamine based materials such as NATA (4,4',4''-Tris(N,N-diphenyl-amino)triphenylamine), 2T-NATA (4,4',4''-tris (N-(2-naphthyl)-N-phenylamino)triphenylamine) and NPNPB (N,N'-diphenyl-N,N'-di-[4-(N,N-diphenyl-amino)phenyl]benzidine); and p-doped materials such as F4-TCNQ (2,3,5,6-Tetrafluoro-7,7,8,8-tetracyanoquinodimethane) and PPDN (pyrazino(2,3-f)[1,10]phenanthroline-2,3-dicarbonitrile).

The hole transporting layer 284 is formed on the hole injecting layer 282. The hole transporting layer 284 can be formed through a solution process. The hole transporting layer 284 can be separated by the red, green, blue and white pixel regions Pr, Pg, Pb and Pw. Alternatively, the hole transporting layer 284 in one pixel region Pr, Pg, Pb and Pw can be connected to another hole transporting layer 284 in a next pixel region Pr, Pg, Pb and Pw to form one body.

For instance, the hole transporting layer 284 can be formed of one selected from, but is not limited to, a material group including arylamine based materials, starburst aromatic amine based materials, spiro-ladder type materials, NPD (N,N-dinaphthyl-N,N'-diphenyl benzidine), s-TAD (2,2',7,7'-tetrakis-(N,N-diphenylamino)-9,9-spirobifluoren), and MTDATA (4,4',4''-tris (N-3-methylphenyl-N-phenylamino)-triphenylamine).

The arylamine based materials can include TPD (N,N'-bis-(3-methylphenyl)-N,N'-bis-(phenyl)-benzidine), PPD, TTBND, FFD, p-dmDPS and TAPC. The starburst aromatic amine based materials can include TCTA, PTDATA, TDAPB, TDBA, 4-a and TCTA. The spiro-ladder type materials can include spiro-TPD (N,N'-Bis(3-methylphenyl)-N,N'-bis(phenyl)-2,7-diamino-9,9-spirobifluorene), spiro-mTTB (2,2',7,7'-Octa(m-tolylamine)-9,9-spirobifluorene) and spiro-2.

The hole injecting layer 282 and the hole transporting layer 284 constitute a hole auxiliary layer.

The light emitting material layer 286 is formed on the hole transporting layer 284. The light emitting material layer 286 can be formed through a solution process. The light emitting material layer 286 includes a red light emitting material layer 286a, a green light emitting material layer 286b, a blue light emitting material layer 286c and a white light emitting material layer 286d corresponding to the red, green, blue and white pixel regions Pr, Pg, Pb and Pw, respectively. The red, green and blue light emitting material layers 286a, 286b and 286c include red, green and blue light emitting materials R, G and B emitting red, green and blue, respectively.

The white light emitting material layer 286d includes first, second and third light emitting material layers 287a, 287b and 287c sequentially layered on the hole transporting layer 284. Each of the first, second and third light emitting material layers 287a, 287b and 287c can include one of red, green and blue light emitting materials. The materials of the first, second and third light emitting material layers 287a, 287b and 287c can be different from each other. For example, as shown in FIG. 6, the first, second and third light emitting material layers 287a, 287b and 287c of the white light emitting material layer 286d can include red, green and blue light emitting materials R, G and B, respectively. Here, the first light emitting material layer 287a further includes an electron blocking material (EBM). The electron blocking material has relatively high triplet energy (T1). Therefore, the electron blocking material blocks excitons and prevents electrons from flowing into the hole transporting layer 274 and the hole injecting layer 282. In the first light emitting material layer 276a, the content (or the amount) of the electron blocking material can be equal to or more than the content (or the amount) of the light emitting material of the first light emitting material layer 287a, for example, the content of the red light emitting material.

Meanwhile, to implement white light having a predetermined color temperature, it is beneficial that a thickness of the second light emitting material layer 287b is equal to or larger than a thickness of the first light emitting material layer 287a and is smaller than a thickness of the third light emitting material layer 287c. The ratio of the thicknesses of the first, second and third light emitting material layers 287a, 287b and 287c can be 1:1:2.5.

For instance, in the white pixel region Pw, the first light emitting material layer 287a is formed by dropping five drops of a first solution including an electron blocking material, dropping one drop of a second solution including a red light emitting material and drying the first and second solutions, the second light emitting material layer 287b equal to or thicker than the first light emitting material layer 287a is formed on the first light emitting material layer 287a by dropping seven drops of a third solution including a green light emitting material and drying the third solution, and the third light emitting material layer 287c thicker than the second light emitting material layer 287b is formed on the second light emitting material layer 287b by dropping twenty drops of a fourth solution including a blue light emitting material and drying the fourth solution. Accordingly, the first light emitting material layer 287a can have the thickness of about 20 nm, the second light emitting material layer 287b can have the thickness of about 20 nm, and the third light emitting material layer 287c can have the thickness of about 50 nm. However, the number of dropping a solution and the thickness of a light emitting material layer are not limited to these and can be changed according to a concentration of the solution.

The first, second and third light emitting material layers 287a, 287b and 287c can be formed together in steps of forming the red, green and blue light emitting material layers 286a, 286b and 286c, respectively.

Alternatively, the first light emitting material layer 287a can be formed by dropping a solution including a mixture of a red light emitting material and an electron blocking material and drying the solution. The first light emitting material layer 287a can be formed in a step different from the red light emitting material layer 286a.

Here, the red light emitting material can be formed of a host material, which includes at least one of a carbazole material such as CBP (carbazole biphenyl) and mCP (1,3-bis(carbazol-9-yl)); fluorene; and acridine containing an alkyl group, and a dopant material, which contains at least one selected from a phosphorescent material group including PIQIr(acac)(bis(1-phenylisoquinoline)acetylacetonate iridium), PQIr(acac)(bis (1-phenylquinoline)acetylacetonate iridium), PQIr(tris(1-phenylquinoline)iridium), and PtOEP (octaethylporphyrin platinum). Alternatively, the red light emitting material can be formed of a fluorescent material including PBD:Eu(DBM)3(Phen), Perylene, and so on, as the dopant material. However, the red light emitting material is not limited to these. The host and the dopant of the red light emitting material can be connected to each other, thereby forming one type of a monomer, an oligomer and a polymer.

The electron blocking material can be formed of, but is not limited to, at least one selected from a material group including BPAPF (9,9-bis [4-(N,N-bis-biphenyl-4-ylamino) phenyl]-9H-fluorene), DTASI (bis[4-(p,p-ditolylamino)phenyl]diphenylsilane, NPD (4,4'-bis[N-(1-napthyl)-N-phenylamino]biphenyl), mCP (N,N'-dicarbazolyl-3,5-benzene), MPMP (bis[4-(N,Ndiethylamino)-2-methylphenyl](4-methylphenyl)methane), arylamine based materials, starbust aromatic amine based materials, spiro-ladder type materials, NPD (N,N-dinaphthyl-N,N'-diphenyl benzidine), s-TAD (2,2',7,7'-tetrakis-(N,N-diphenylamino)-9,9-spirobifluoren), and MTDATA (4,4',4''-tris (N-3-methylphenyl-N-phenyl-amino)-triphenylamine). The arylamine based materials can include TPD (N,N'-bis-(3-methylphenyl)-N,N'-bis-(phenyl)-benzidine), PPD, TTBND, FFD, p-dmDPS and TAPC. The starburst aromatic amine based materials can include TCTA, PTDATA, TDAPB, TDBA, 4-a and TCTA. The spiro-ladder type materials can include spiro-TPD (N,N'-Bis (3-methylphenyl)-N,N'-bis(phenyl)-2,7-diamino-9,9-spirobifluorene), spiro-mTTB (2,2',7,7'-Octa(m-tolylamine)-9,9-spirobifluorene) and spiro-2. The electron blocking material can be one type of a monomer, an oligomer and a polymer.

In addition, the green light emitting material can be formed of a host material, which includes at least one of a carbazole material such as CBP (carbazole biphenyl) and mCP (1,3-bis(carbazol-9-yl)); fluorene; and acridine containing an alkyl group, and a dopant material, which contains a phosphorescent material including Ir(ppy)3(fac tris (2-phenylpyridine)iridium), and so on. Alternatively, the green light emitting material can be formed of a fluorescent material including Alq3(tris(8-hydroxyquinolino)aluminum), and so on, as the dopant material. However, the green light emitting material is not limited to these. The host and the dopant of the green light emitting material can be connected to each other, thereby forming one type of a monomer, an oligomer and a polymer.

Meanwhile, the blue light emitting material can be formed of a host material, which includes at least one of a carbazole material such as CBP (carbazole biphenyl) and mCP (1,3-bis(carbazol-9-yl)); fluorene; and acridine containing an alkyl group, and a dopant material, which contains a phosphorescent material including (4,6-F2ppy)2Irpic, and so on. Alternatively, the blue light emitting material can be formed of a fluorescent material, which contains at least one selected from a material group including anthracene, spiro-DPVBi, spiro-6P, distyryl benzene (DSB), distyryl arylene (DSA), PFO-based polymer and PPV-based polymer, as the dopant material. However, the blue light emitting material is not limited to these. The host and the dopant of the blue light emitting material can be connected to each other, thereby forming one type of a monomer, an oligomer and a polymer.

Next, the electron transporting layer 288 is formed on the light emitting material layer 286. The electron transporting layer 288 can be formed through a solution process. The electron transporting layer 288 can be separated by the red, green, blue and white pixel regions Pr, Pg, Pb and Pw. Alternatively, the electron transporting layer 288 in one pixel region Pr, Pg, Pb and Pw can be connected to another electron transporting layer 288 in a next pixel region Pr, Pg, Pb and Pw to form one body.

For example, the electron transporting layer 288 can be formed of at least one selected from a material group including Alq3 (tris(8-hydroxyquinolino)aluminum), PBD, TAZ, spiro-PBD, BAlq, and SAlq, but is not limited to these.

The second electrode 292 is formed on the electron transporting layer 288 as a cathode. The second electrode 292 can be formed through a deposition process. The second electrode 292 in one pixel region Pr, Pg, Pb and Pw can be connected to another second electrode 292 in a next pixel region Pr, Pg, Pb and Pw to form one body.

For instance, the second electrode 292 can be formed of, but is not limited to, one of aluminum (Al), magnesium (Mg) and alloy of aluminum and magnesium (AlMg).

In the meantime, to inject electrons well, an electron injecting layer can be formed between the electron transporting layer 288 and the second electrode 292. The electron transporting layer 288 and the electron injecting layer can constitute an electron auxiliary layer.

Figure 7A:
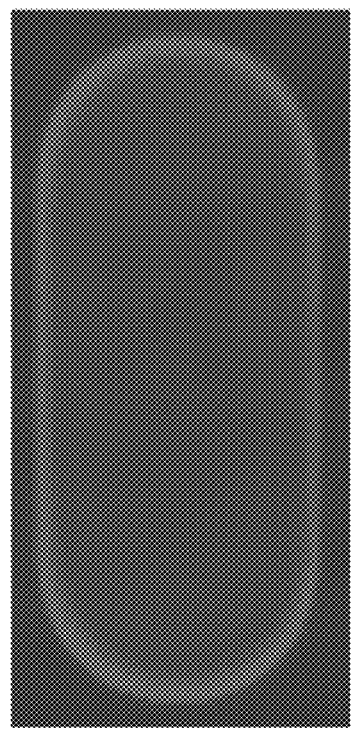
FIGS. 7A and 7B are pictures showing the light emitting material layer and an emission image in the white pixel region of the OLED display device according to the second embodiment of the present disclosure.
Figure 7B:
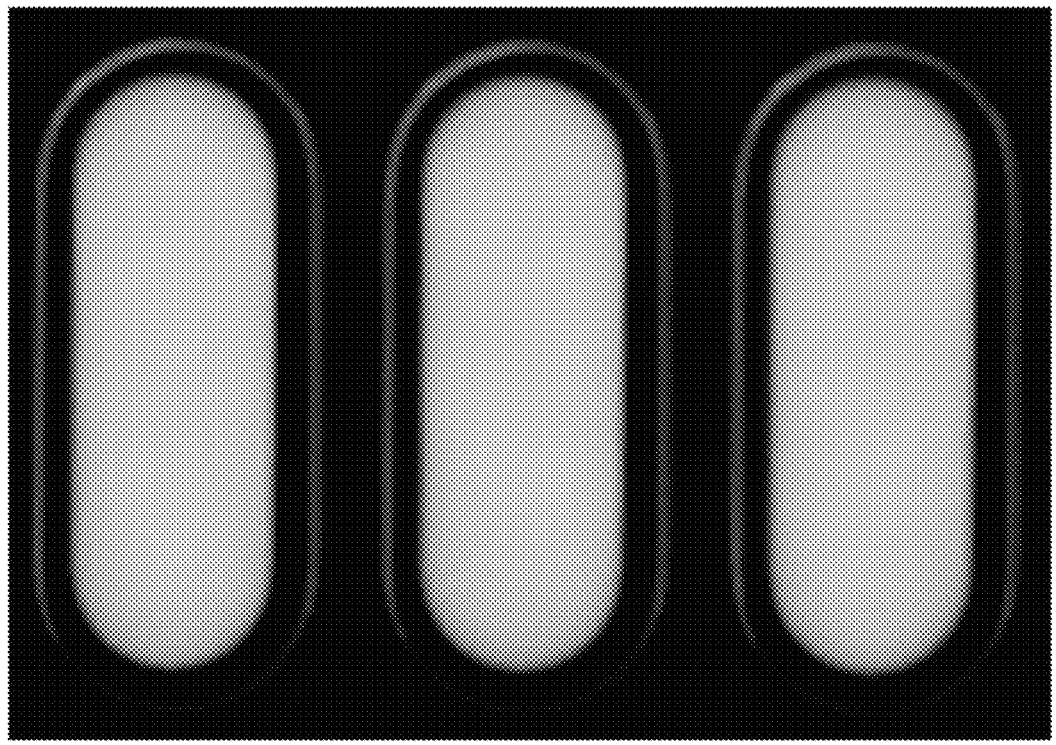

FIGS. 7A and 7B are pictures showing the light emitting material layer and an emission image in the white pixel region of the OLED display device according to the second embodiment of the present disclosure.

As shown in FIG. 7A, in the OLED display device according to the second embodiment, a solution or solutions including the red light emitting material and the electron blocking material are dropped a lot in the white pixel region Pw, and the dropped solution or solutions are uniformly spread in the white pixel region Pw.

Accordingly, the first light emitting material layer 287a, which include a relatively low amount of the red light emitting material, is uniformly formed in the white pixel region Pw, and as shown in FIG. 7B, the uniform emission image can be implemented in the white pixel region Pw.

Like this, in the OLED display device according to the second embodiment, since the light emitting material layer 286 can be formed through the solution process, which is applicable to a relatively small area, the manufacturing costs can be reduced due to a decrease in the number of the evaporation processes, and an OLED display device having a large size and high definition can be produced.

Moreover, because one pixel further includes the white sub pixel emitting the white light in addition to the red, green and blue sub pixels, the power consumption can be lowered.

Furthermore, since the first light emitting material layer 287a of the white light emitting material layer 286d includes the electron blocking material, performance and stability of a device can be improved, and a uniform emission image can be implemented.

In the above embodiments, even though one pixel includes a red sub pixel, a green sub pixel, a blue sub pixel and a white sub pixel, the pixel is not limited to this. That is, one pixel includes at least one red, at least one green, at least one blue and at least one white sub pixels, and the pixel can further include one or more sub pixels of a specific color or colors as occasion demands. For example, one pixel can include one red sub pixel, one green sub pixel, one white sub pixel and two blue sub pixels.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. An organic light emitting diode comprising:
   a first electrode;
   a hole auxiliary layer on the first electrode;
   a light emitting material layer on the hole auxiliary layer and emitting white light;
   an electron auxiliary layer on the light emitting material layer; and
   a second electrode on the electron auxiliary layer,
   wherein the light emitting material layer includes a first light emitting material layer, a second light emitting material layer and a third light emitting material layer sequentially layered,
   wherein the first light emitting material layer includes a light emitting material comprising a host material and a dopant material, and an electron blocking material and forms a single layer, and
   wherein the light emitting material and the electron blocking material are mixed in the first light emitting material layer.

2. The organic light emitting diode of claim 1, wherein a thickness of the second light emitting material layer is equal to or larger than a thickness of the first light emitting material layer and is smaller than a thickness of the third light emitting material layer.

3. The organic light emitting diode of claim 2, wherein a ratio of the thicknesses of the first, second and third light emitting material layers is 1:1:2.5.

4. The organic light emitting diode of claim 1, wherein the first, second and third light emitting material layers include red, green and blue light emitting materials, respectively.

5. The organic light emitting diode of claim 1, wherein each of the first, second and third light emitting material layers includes one of red, green and blue light emitting materials, and the first, second and third light emitting material layers include different light emitting materials from each other.

6. The organic light emitting diode of claim 5, wherein an amount of the electron blocking material is equal to or larger than an amount of the light emitting material in the first light emitting material layer.

7. The organic light emitting diode of claim 1, wherein the first light emitting material layer is disposed closer to the hole auxiliary layer than the second light emitting material layer and the third light emitting material layer.

8. An organic light emitting diode display device comprising:
   a substrate on which first, second, third and fourth pixel regions are defined;
   a first electrode in each of the first, second, third and fourth pixel regions on the substrate;
   a light emitting layer on the first electrode and including first, second, third and fourth color light emitting material layers disposed in the first, second, third and fourth pixel regions, respectively;
   a second electrode on the light emitting layer;
   a hole auxiliary layer between the first electrode and the light emitting layer; and
   an electron auxiliary layer between the light emitting layer and the second electrode,
   wherein the fourth color light emitting material layer is a white light emitting material layer, and includes a first light emitting material layer, a second light emitting material layer and a third light emitting material layer sequentially layered,
   wherein the first light emitting material layer includes an electron blocking material,
   wherein the hole auxiliary layer and the electron auxiliary layer respectively contact a lower surface and an upper surface of the first color light emitting material layer in the first pixel region, and
   wherein the hole auxiliary layer and the electron auxiliary layer respectively contact a lower surface of the first light emitting material layer and an upper surface of the third light emitting material layer in the fourth pixel region.

9. The organic light emitting diode display device of claim 8, wherein a thickness of the second light emitting material layer is equal to or larger than a thickness of the first light emitting material layer and is smaller than a thickness of the third light emitting material layer.

10. The organic light emitting diode display device of claim 8, wherein a ratio of the thicknesses of the first, second and third light emitting material layers is 1:1:2.5.

11. The organic light emitting diode display device of claim 8, wherein the first, second and third light emitting material layers include red, green and blue light emitting materials, respectively.

12. The organic light emitting diode display device of claim 8, wherein each of the first, second and third light emitting material layers includes one of red, green and blue light emitting materials, and the first, second and third light emitting material layers include different light emitting materials from each other.

13. The organic light emitting diode display device of claim 12, wherein an amount of the electron blocking material is equal to or larger than an amount of the light emitting material in the first light emitting material layer.

14. The organic light emitting diode display device of claim 8, wherein the first light emitting material layer is disposed closer to the first electrode than the second light emitting material layer and the third light emitting material layer.

15. The organic light emitting diode display device of claim 8, wherein the first light emitting material layer further includes a light emitting material comprising a host material and a dopant material, and the light emitting material and the electron blocking material are mixed in the first light emitting material layer.

16. The organic light emitting diode display device of claim 15, wherein the first light emitting material layer forms a single layer.

* * * * *